(12) United States Patent
Jin et al.

(10) Patent No.: US 10,342,080 B2
(45) Date of Patent: Jul. 2, 2019

(54) SYSTEM-IN-PACKAGE FOR LED DRIVING AND LED LIGHTING DEVICE INCLUDING THE SAME

(71) Applicant: Seoul Semiconductor Co., Ltd., Ansan-si (KR)

(72) Inventors: Sung Ho Jin, Ansan-si (KR); Sang Wook Han, Ansan-si (KR); Hyung Jin Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/847,821

(22) Filed: Dec. 19, 2017

(65) Prior Publication Data

US 2018/0116021 A1 Apr. 26, 2018

Related U.S. Application Data

(60) Provisional application No. 62/438,555, filed on Dec. 23, 2016.

(51) Int. Cl.
*H05B 33/08* (2006.01)
*F21S 2/00* (2016.01)
(Continued)

(52) U.S. Cl.
CPC .......... *H05B 33/0824* (2013.01); *F21S 2/005* (2013.01); *F21V 29/713* (2015.01);
(Continued)

(58) Field of Classification Search
CPC . H05B 33/0824; H05B 33/089; F21V 29/713; F21S 2/005; F28F 3/022;
(Continued)

(56) References Cited

U.S. PATENT DOCUMENTS

| 2003/0034564 A1* | 2/2003 | Palanisamy ......... H01S 5/02248 |
| | | 257/778 |
| 2015/0097484 A1* | 4/2015 | Lee .................... H05B 33/0848 |
| | | 315/85 |
| 2017/0055323 A1 | 2/2017 | Lim et al. |

FOREIGN PATENT DOCUMENTS

| EP | 2320710 | 5/2011 |
| KR | 10-2017-0022837 | 3/2017 |
| WO | 2013081725 | 6/2013 |

OTHER PUBLICATIONS

Written Opinion dated Apr. 18, 2018, issued in International Application No. PCT/KR2017/015304.

(Continued)

*Primary Examiner* — Tung X Le
*Assistant Examiner* — Henry Luong
(74) *Attorney, Agent, or Firm* — H.C. Park & Associates, PLC

(57) ABSTRACT

A light-emitting diode (LED) lighting apparatus including at least one LED group including a plurality of LEDs, a rectifier configured to rectify an alternating current (AC) voltage and generate a driving voltage for the at least one LED group, and a system-in-package (SIP) configured to drive and control the at least one LED group, in which the SIP is connected to the at least one LED group and the rectifier, and includes a driving module, a functional module, and a first resistor disposed on a single substrate.

18 Claims, 12 Drawing Sheets

(51) Int. Cl.
*F28F 3/02* (2006.01)
*F28F 3/08* (2006.01)
*F21V 29/71* (2015.01)
*F21V 29/80* (2015.01)
*H01L 23/367* (2006.01)
*H01L 23/498* (2006.01)
*H01L 25/065* (2006.01)
*B23P 15/26* (2006.01)
*F21Y 115/10* (2016.01)

(52) U.S. Cl.
CPC .............. *F21V 29/80* (2015.01); *F28F 3/022* (2013.01); *F28F 3/08* (2013.01); *H01L 23/3672* (2013.01); *H01L 23/49811* (2013.01); *H01L 25/0655* (2013.01); *H05B 33/089* (2013.01); *B23P 15/26* (2013.01); *B23P 2700/10* (2013.01); *F21Y 2115/10* (2016.08); *Y10T 29/4935* (2015.01)

(58) Field of Classification Search
CPC .. F28F 3/08; H01L 23/3672; H01L 23/49811; H01L 25/0655
See application file for complete search history.

(56) References Cited

OTHER PUBLICATIONS

International Search Report dated Apr. 18, 2018, issued in International Application No. PCT/KR2017/015304.

\* cited by examiner

SYSTEM-IN-PACKAGE FOR LED DRIVING AND LED LIGHTING DEVICE INCLUDING THE SAME

CROSS-REFERENCE TO RELATED APPLICATION

This application claims the benefit of U.S. Provisional Patent Application No. 61/438,555, filed on Dec. 23, 2016, which is hereby incorporated by reference for all purposes as if fully set forth herein.

BACKGROUND

Field

Exemplary embodiments relate to an alternating current (AC) driving type light emitting diode (LED) lighting device and a system-in-package (SIP) for driving an LED included in the same.

Discussion of the Background

In general, in order to drive an LED using an AC voltage, a circuit that coverts the AC voltage into a rectified voltage and adjusts the number of LED elements emitting light in accordance with the fluctuation of the magnitude of the rectified voltage may be utilized. In recent years, dimmable LED lighting devices, which are capable of adjusting the intensity of light according to user's needs, are widely used in addition to LED lighting devices that provide only a constant light.

However, in AC driving type lighting devices, since the LED elements are driven with a rectified voltage, it is difficult to operate the dimming function and to secure the linearity in the dimming control. Accordingly, various circuit elements may be provided in the AC driving type lighting device to overcome such disadvantages. However, these various circuit elements are separately packaged and mounted on a substrate, which increases the size and manufacturing cost of the product.

The above information disclosed in this Background section is only for enhancement of understanding of the background of the inventive concepts and, therefore, it may contain information that does not constitute prior art.

SUMMARY

Exemplary embodiments provide a SIP for LED driving and LED lighting device including the SIP capable of reducing size and manufacturing cost of the product.

Additional aspects will be set forth in part in the description which follows and, in part, will be apparent from the disclosure, or may be learned by practice of the inventive concepts.

According to an exemplary embodiment, a light-emitting diode (LED) lighting apparatus includes at least one LED group including a plurality of LEDs, a rectifier configured to rectify an alternating current (AC) voltage and generate a driving voltage for the at least one LED group, a SIP configured to drive and control the at least one LED group, the SIP connected to the at least one LED group and the rectifier, in which the SIP includes comprises a driving module, a functional module, and a first resistor disposed on a single substrate.

The driving module may include a driving controller configured to determine magnitude of the driving voltage and control driving of the at least one LED group according to the magnitude of the driving voltage, and a driving current controller configured to control a current flowing in each LED group to have a constant value.

The driving module may include an internal power supply unit configured to generate an internal power used in the driving module from the driving voltage, an LED driving current setting unit configured to set an LED driving current value for each operation period based on resistance values of external LED driving current setting resistors, and a dimming control unit configured to provide a dimming signal to at least one of the driving controller and the LED drive current setting unit.

The functional module may include a dimming level detector configured to receive the driving voltage and detect currently selected dimming level based on the driving voltage.

The functional module may further include a surge protector configured to protect the at least one LED group from an over voltage or an over current.

The first resistor may be a bleeder resistor having a high resistance value.

The driving module and the first resistor may generate the greatest amount of heat in the SIP, and a distance between the driving module and the first resistor within the single substrate may be greater than a distance between the driving module and the functional module and a distance between the first resistor and the functional module.

The SIP may further include a heat dissipating unit disposed on a bottom surface opposing an upper surface of the single substrate on which the driving module, the functional module, and the first resistor are disposed.

The driving module and the first resistor may be connected to the heat dissipating unit.

The heat dissipating unit may include a plurality of patterns spaced apart from each other, the patterns disposed on the lower surface of the single substrate to correspond to the driving module and the first resistor, respectively.

The single substrate may have a plurality of via holes to connect the thriving module and the first resistor to the patterns of the heat dissipating unit.

The SIP may further include first signal pins configured to input and output a first signal for controlling the operation of the at least one of the light emitting groups, and second signal pins configured to input and output a second signal for controlling the driving of the driving controller.

The first signal pins may be disposed along a first end of the single substrate and the second signal pins may be disposed along a second end opposing the first end of the single substrate.

The driving module and the first resistor may be disposed adjacent to opposing corners of the single substrate, respectively.

According to an exemplary embodiment, a SIP for an LED lighting apparatus having at least one LED group and a rectifier configured to rectify an alternating current (AC) voltage and generate a driving voltage includes a driving module including a driving controller configured to determine the magnitude of the driving voltage and control driving of the at least one LED group according to the magnitude of the driving voltage, and a driving current controller configured to control a current flowing in each LED group to have a constant value, a functional module including a dimming level detector configured to receive the driving voltage and detect currently selected dimming level based on the driving voltage, and a first resistor having a high resistance value to prevent high power from being consumed by the driving module, in which the driving module, the function module, and the first resistor are disposed on a single substrate.

The driving module and the first resistor may generate the greatest amount of heat in the SIP, and a distance between the driving module and the first resistor within the single substrate may be greater than a distance between the driving module and the functional module and a distance between the first resistor and the functional module.

The SIP may further include a heat dissipating unit disposed on a lower surface opposing an upper surface of the single substrate on which the driving module, functional module, and the first resistor are formed, in which the heat dissipating unit may include a plurality of patterns disposed on the lower surface of the single substrate to correspond to the driving module and the first resistor, respectively.

The single substrate may have a plurality of via holes to connect the driving module and the first resistor to the patterns of the heat dissipating unit.

The SIP may further include first signal pins configured to input and output a first signal for controlling the operation of the at least one light emitting groups and second signal pins configured to input and output a second signal for controlling the driving of the driving controller.

The first signal pins may be disposed along a first end of the single substrate and the second signal pins may be disposed along a second end opposing the first end of the single substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
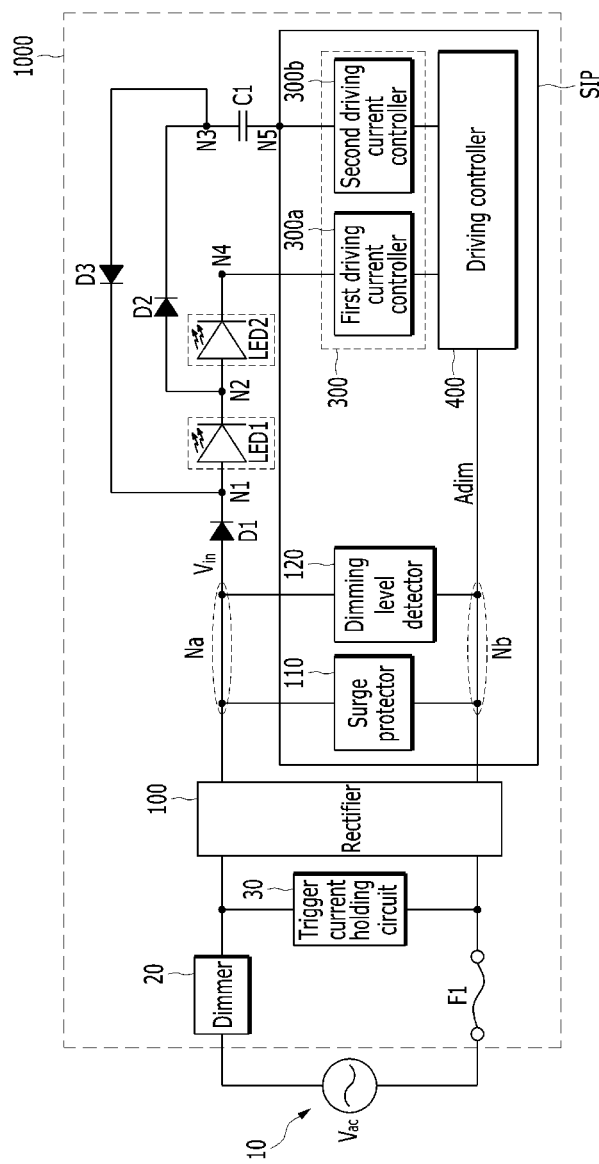
FIG. 1 is a block diagram of an LED lighting device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a block diagram of an LED lighting device according to an exemplary embodiment.

The LED lighting device 1000 according to an exemplary embodiment may include a dimmer 20, a rectifier 100, a surge protector 110, a dimming level detector 120, a driving current controller 300, a driving controller 400, and LED element groups LED1 and LED2.

The dimmer 20 receives an AC voltage Vac from an AC voltage source and generates and output AC power, which is modulated into a dimming level selected by a user's manipulation. The dimmer 20 may be one of a TRIAC dimmer phase-cutting a phase of the AC power using a TRIAC, a pulse width modulation (PWM) dimmer, and an analog voltage dimmer changing the AC voltage, and so on.

For example, when the TRIAC is used as the dimmer 20, a phase-controlled AC voltage can be output by phase-cutting (e.g., phase-cutting) the input AC power based on the dimming level selected by the user.

Although FIG. 1 shows that the dimmer 20 is included in the LED lighting device 1000, the inventive concepts are not limited thereto. For example, the dimmer 20 may be located outside the LED lighting device 1000 and electrically connected to the LED lighting device 1000.

When the TRIAC is used as the dimmer 20, it may be necessary to control a TRIAC trigger current. Accordingly, the LED lighting device 1000 may further include a trigger current holding circuit 30 connected between the dimmer 20 and the rectifier 100. For example, the trigger current holding circuit 30 may be a bleeder circuit including a bleeder capacitor and a bleeder resistor connected in series.

The rectifier 100 rectifies the phase-controlled AC voltage output from the dimmer 20, and outputs a driving voltage Vin. The driving voltage Vin output from the rectifier 100 is applied to the dimming level detector 120, the driving controller 400, and the LED element groups LED1 and LED2.

The LED lighting device 1000 may further include the surge protector 110 for protecting the driving controller 400 and the LED element groups LED1 and LED2 from an over voltage and/or an over current.

The LED element groups LED1 and LED2 may include a plurality of LED elements, and the lighting sequence of the LED element groups LED1 and LED2 may be controlled by the driving controller 400. Although FIGS. 1 and 2 show that the LED element groups include the first LED element group LED1 and the second LED element group LED2, the inventive concepts are not limited thereto, and the number of LED element groups may be varied as needed.

The first LED element group LED1 and the second LED element group LED2 may have the same forward voltage level or different forward voltage levels from each other. For example, when the first LED element group LED1 and the second LED element group LED2 include different numbers of LED elements, or when the first LED element group LED1 and the second LED element group LED2 have different serial and/or parallel connection relationships from each other, the first LED element group LED1 and the second LED element group LED2 may have different forward voltage levels.

Hereinafter, the first and second LED element groups LED1 and LED2 will be described as having the same forward voltage level.

The first forward voltage level Vf1 may be a threshold voltage level for driving the first LED element group LED1, and the second forward voltage level Vf2 may be a threshold voltage level for driving the first and the second LED element group connected in series. For example, the second forward voltage level Vf2 may be the sum of the forward voltage level of the first LED group LED1 and the forward voltage level of the second LED group LED2.

According to an exemplary embodiment, a capacitor C1 is provided on the current path of the first LED group LED1, and the capacitor C1 is charged when the input driving voltage Vin is equal to or higher than a first voltage, and is discharged when the input driving voltage Vin is lower than a second voltage, so that the LED element groups LED1 and LED2 output a constant amount of light.

In addition, diodes D1, D2, and D3 may be provided to prevent a reverse current from flowing in each current path for light emission of the LED element groups LED1 and LED2. The light emitting operation of the LED element groups LED1 and LED2 will be described in more detail below with reference to FIGS. 2A to 2C.

The dimming level detector 120 receives the driving voltage Vin output from the rectifier 100, detects the currently selected dimming level based on the input driving voltage Vin, and output the detected dimming level signal to the driving controller 400. For example, the dimming level detector 120 may detect a dimming level by averaging a driving voltage Vin, whose voltage level varies with time.

As described above, when the dimmer 20 controls the phase of the AC voltage Vac (e.g., phase cut) corresponding to the selected dimming level, the dimming level currently selected can be detected by averaging the driving voltage Vin.

In addition, the dimming level signal Adim corresponding to the specific dimming level output from the dimming level detector 120 may be a DC signal having a constant voltage value. For example, if the dimming level is 100%, the corresponding dimming level signal (Adim) may be 2V, if the dimming level is 90%, the corresponding dimming level signal (Adim) may be 1.8V, and if the dimming level is 50%, the corresponding dimming level signal (Adim) may be 1V.

The value and the range of the dimming level signal Adim corresponding to the specific dimming level can be changed by appropriately selecting the values of the circuit elements forming the dimming level detector 120.

The driving controller 400 receives the driving voltage Vin output from the rectifier 100, determines the magnitude of the driving voltage Vin, and controls the driving of the LED element groups LED1 and LED2 according to the magnitude of the driving voltage Vin. For example, the driving controller 400 controls the driving current controllers 300a and 300b connected to the LED element groups LED1 and LED2, so that a constant current flows through the corresponding LED element groups LED1 and LED2. The driving method of the LED element groups LED1 and LED2 will be described in more detail below with reference to FIGS. 2A to 2C.

The driving controller 400 also receives the dimming level signal Adim output from the dimming level detector 120, and limits a maximum value of the LED element driving current $I_{LED}$ based on the dimming level signal Adim.

More particularly, when the dimming is operated by the TRIAC as described above, since the emission time of the LED element groups LED1 and LED2 is controlled by the phase control (e.g., phase cut) driving voltage Vin, and the magnitude of the LED element driving current $I_{LED}$ is simultaneously controlled based on the dimming level, smooth dimming characteristics may be facilitated over the entire dimming level.

As described above, the LED lighting device 1000 according to an exemplary embodiment may include various circuit elements for driving and implementing dimming functions of the LED element groups LED1 and LED2. In this case, when each circuit element is provided as a separate package, and is individually mounted on a substrate while being electrically connected to each other, the size of the LED lighting device may be increased and the manufacturing cost thereof would also be increased.

According to an exemplary embodiment, as shown in FIG. 1, each of the circuit elements including the surge protector 110, the dimming level detector 120, the driving current controller 300, and the driving controller 400 are integrated as a single package, so that the size of the product is reduced and the manufacturing cost thereof is also reduced.

The specific arrangement, the pin arrangement, and the arrangement relationship of the internal circuit elements of the system-in-package (SIP) according to the exemplary embodiment will be described in more detail below with reference to FIG. 5 to FIG. 7.

Figure 2A:
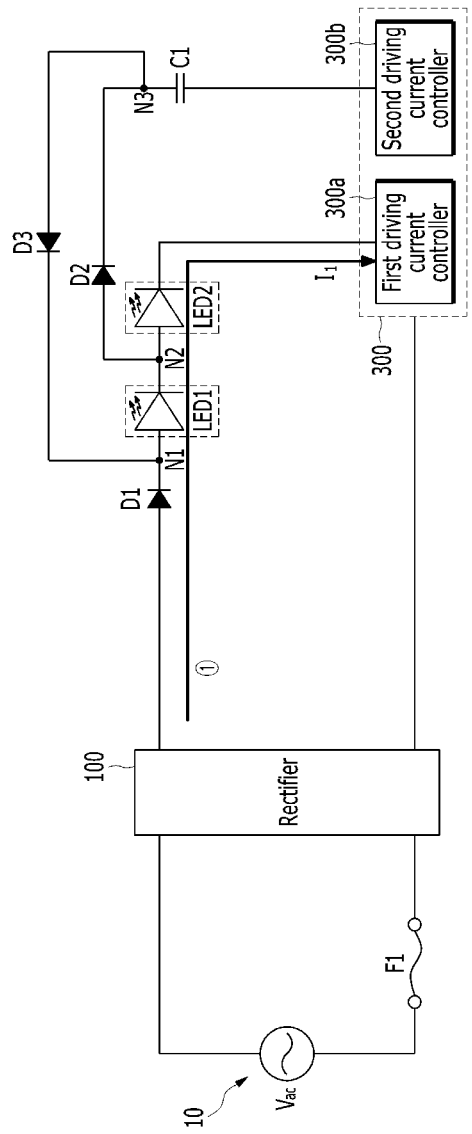
FIG. 2A, FIG. 2B, and FIG. 2C are views illustrating a method of driving an LED lighting device according to an exemplary embodiment.
Figure 2B:
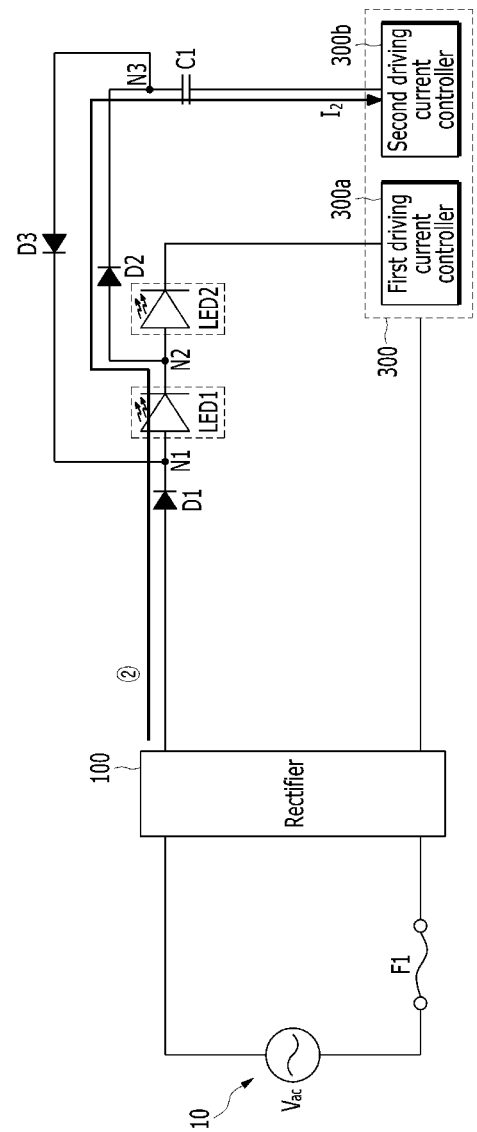
Figure 2C:
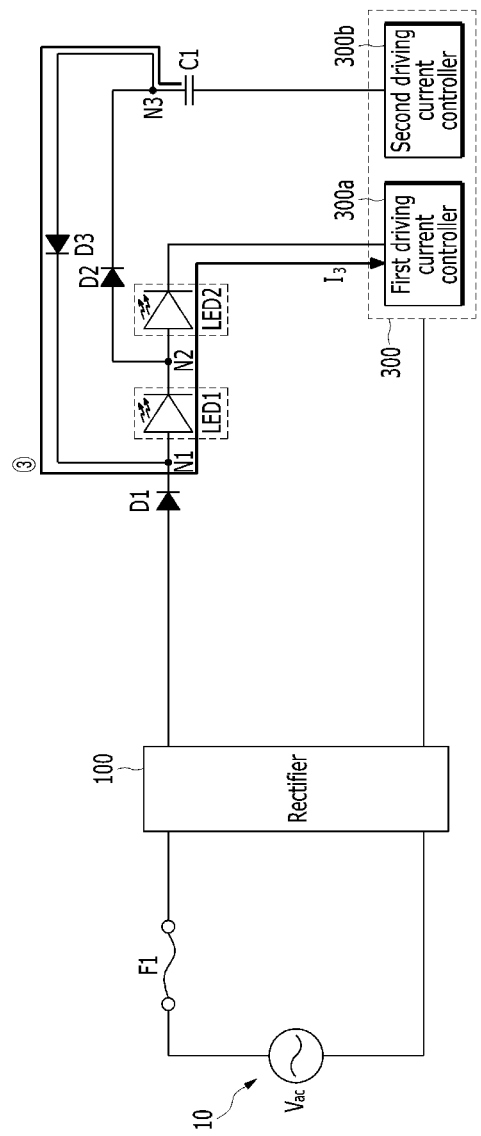
Figure 3:
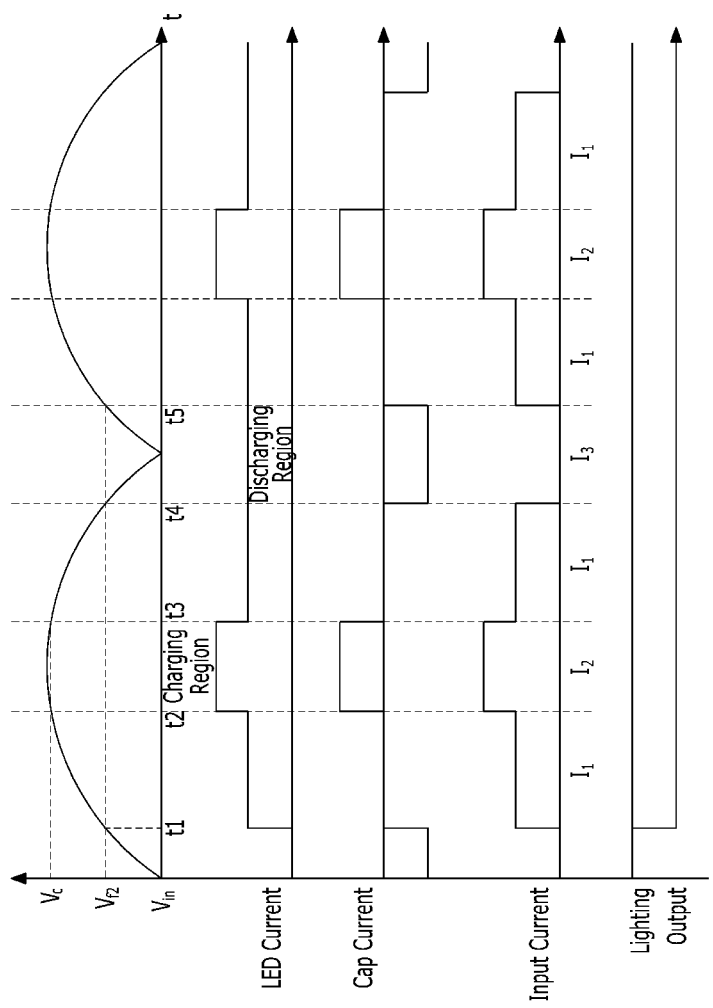
FIG. 3 is a waveform diagram showing a rectified voltage, an LED driving current, an input current, and a lighting output relationship of an LED light emitting part according to an exemplary embodiment.

FIGS. 2A to 2C are views illustrating a method of driving an LED lighting device according to an exemplary embodiment. FIG. 3 is a waveform diagram showing a rectified voltage, an LED driving current, an input current, and a lighting output relationship of an LED light emitting part according to an exemplary embodiment.

FIGS. 2A to 2C show only some of the components related to the operation of the LED element groups LED1 and LED2 for convenience of description, and thus, the inventive concepts are not limited thereto.

Referring to FIG. 2A and FIG. 3, when the LED lighting device 1000 is activated, the LED driving current may not flow until the voltage level of the driving voltage Vin reaches the second forward voltage level Vf2. The first LED drive current may flow through the first current path 1 from the time point (t1) when the voltage level of the drive voltage Vin reaches the second forward voltage level Vf2. At this time, the first LED driving current $I_1$ flowing through the first LED element group LED1 and the second LED element group LED2 is a constant current controlled by the first driving current controller 300a to have a predetermined value.

Referring to FIG. 2B and FIG. 3, when the voltage level of the driving voltage Vin rises and reaches an entry voltage level Vc in a charging region (t2-t3), the driving controller 400 may stop the operation of the first driving current controller 300a and operate the second driving current controller 300b to enter the charging region (t2-t3). Here, the charging period entry voltage level Vc may refer to a threshold voltage level, at which the capacitor C1 connected in series with the first LED element group LED1 can be charged. Referring to FIG. 2B, during the charging period, only the first LED element group LED1 emits light and the second LED element group LED2 does not emit light. That is, the second LED driving current flows through the second current path 2 during a period from t2 to t3, where the voltage level of the driving voltage Vin is equal to or higher than the charging period entry voltage level Vc.

However, when the second LED driving current $I_2$ flows through the second current path 2, since the number of LEDs emitting light is smaller than that when the first LED driving current $I_1$ flows through the first current path 1, the current $I_2$ may be set to a value higher than the first LED driving current $I_1$ to maintain the same light output of the entire LED element group.

Thereafter, when the voltage level of the driving voltage Vin decreases and becomes less than Vc (t3-t4), the operation returns to back to that shown in FIG. 2A, and the first LED driving current $I_1$ flows through the first current path 1. When the voltage level of the driving voltage Vin decreases less than Vf2 (t4-t5) as shown in FIG. 3, the voltage of the capacitor C1 charged during the charging period discharges, so that the third LED driving current $I_3$ flows through the third current path 3 as shown in FIG. 2C and FIG. 3. At this time, since the third LED driving current $I_3$ is controlled by the first driving current controller 300a, the third LED driving current $I_3$ may be substantially equal to the first LED driving current $I_1$.

Figure 4:
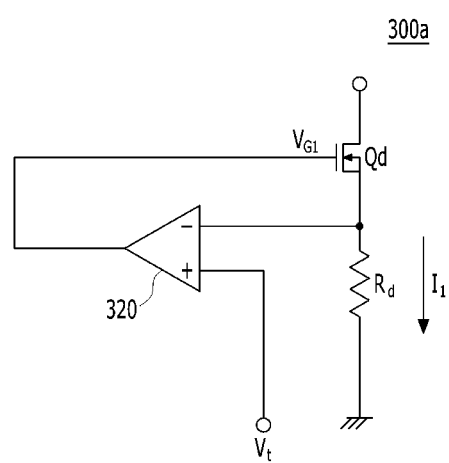
FIG. 4 is a schematic circuit diagram illustrating the operation of the drive current controller shown in FIG. 1.

FIG. 4 is a schematic circuit diagram illustrating the operation of the drive current controller shown in FIG. 1. FIG. 4 only illustrates the first driving current controller 300a as an example, however, the second driving current controller 300b may have the same configuration.

Referring to FIG. 4, the driving current controller 300a includes a linear amplifier 320, a transistor Qd, and a detection resistor Rd. The voltage detected by the detection resistor Rd is applied to the negative input terminal of the linear amplifier 320 and a target voltage Vt may be applied to the positive input terminal.

The output of the linear amplifier 320 may be input to the gate electrode of the transistor Qd. The transistor Qd may be variously implemented as a switching element for a constant current control. The transistor Qd is connected between the cathode terminal of each of the LED element groups LED1 and LED2, and the detection resistor Rd and may be turned on and off according to the output of the linear amplifier 320 applied to the gate electrode.

The transistor Qd and the linear amplifier 320 are included in a feedback circuit, and if the detected voltage at the detection resistor Rd is less than the target voltage Vt, the linear amplifier 320 outputs a high level voltage (e.g., a voltage having a positive value), which is applied to the gate electrode of the transistor Qd.

Figure 5:
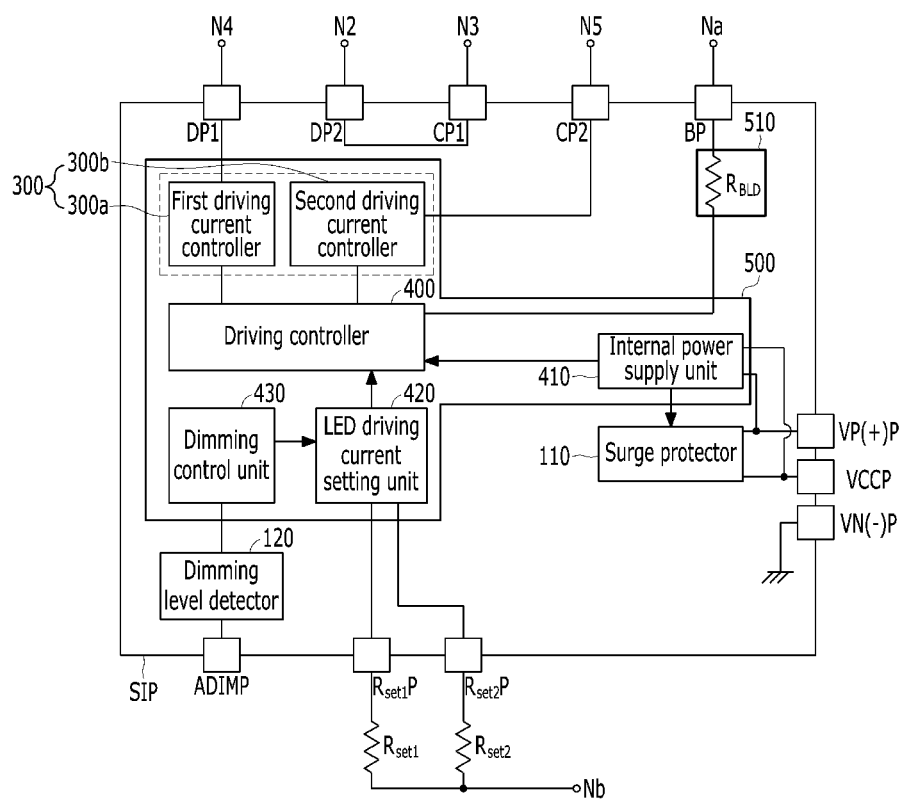
FIG. 5 is a block diagram schematically showing a configuration of a system-in-package according to an exemplary embodiment.

FIG. 5 is a block diagram schematically showing a configuration of a system-in-package according to an exemplary embodiment.

The system-in-package (SIP) according to an exemplary embodiment may include a driving current controller 300 including the first driving current controller 300a and the second driving current controller 300b, a driving controller 400 for controlling the operation of the driving current controller 300, a surge protector 110, and a dimming level detector 120 for driving and controlling the LED element groups LED1 and LED2. The SIP of FIG. 5 includes the same circuit elements described above with reference to FIG. 1 to FIG. 4, and thus, repeated description thereof will be omitted.

Referring to FIG. 5, the SIP may include a driving module 500, which may be implemented as one IC chip, functional modules 110 and 120, and a resistive element 510.

The driving module 500 may include an internal power supply unit 410, an LED driving current setting unit 420, and a dimming control unit 430, the driving current controller 300, and the driving controller 400.

The internal power supply unit 410 generates an internal power used in the driving module 500 from the input driving voltage Vin, and supplies internal power to each component.

The LED driving current setting unit 420 sets the LED driving current value for each operation period based on the resistance values of the external LED driving current setting resistors Rset1 and Rset2. For example, the first LED driving current setting resistor Rset1 is a resistor for setting the first LED driving current value, and the second LED driving current setting resistor Rset2 is a resistor for setting the second LED driving current $I_2$ value.

The dimming control unit 430 receives the signal output from the dimming level detector 120 and provides the signal to the driving controller 400 and/or the LED driving current setting unit 420, when the dimming is performed by the phase control type of dimming control.

However, when the dimming is performed by an analog dimming type, the dimming level is detected based on the analog dimming signal input through the ADIMP terminal instead of the dimming level detector 120, and the detected dimming level is provided to the driving controller 400 and/or the LED driving current setting unit 420.

The functional modules 110 and 120 may be a surge protector 110 and a dimming level detector 120.

The resistive element 510 may transfer high level holding current, which is generated by the trigger current holding circuit 30 (see FIG. 1) to the driving module 500. That is, the resistive element 510 is a bleeder resistor $R_{BLD}$, which is formed to prevent high power from being consumed by the driving module 500 due to the holding current. As such, the resistance value of the resistive element 510 may be high.

The SIP according to an exemplary embodiment includes a plurality of pins. The pins include first signal pins for inputting and outputting a first signal (e.g., a large signal) to control the operation of the LED element groups LED1 and LED2, and second signal pins for inputting and outputting a second signal (e.g., a small signal) to control the driving of the driving controller 400.

For example, the first signal pins may include a first connection pin DP1 connected to the cathode terminal (fourth node N4) of the second LED group LED2, a second connection pin DP2 connected to the cathode terminal (second node N2) of the first LED group LED1, a third connection pin CP1 connected to the first electrode (third node N3) of the capacitor C1, and a fourth connection pin CP2 connected to the second electrode (third node N5) of the capacitor C1.

Referring to FIG. 5, DP1 is connected to the first driving current controller 300a, DP2 is directly connected to CP1, and CP2 is connected to the second driving current controller 300b. In this manner, the SIP can be connected to the LED element groups (LED1 and LED2) including the capacitor C1, as shown in FIG. 1.

The second signal pins may include a bleeder input pin BP for inputting a holding current, driving voltage input pins VP (+) P and VN (−) P for inputting a driving voltage VP, dimming level signal input pin ADIMP for inputting dimming level signal Adim, resistor connection pins Rset1P and Rset2P connected to resistors Rset1 and Rset2, respectively, and an internal power pin VCCP connected to the ground.

Referring to FIG. 5, BP is connected to the bleeder resistor $R_{BLD}$, and the driving voltage input pins VP (+) P and VN (−) P are connected to the internal power supply unit 410 and the surge protector 110.

In addition, the dimming level signal input pin ADIMP is connected to the dimming level detector 120, when the signal applied to the ADIMP is a phase controlled AC voltage Vin output from the dimmer 20. The resistor connection pins Rset1P and Rset2P are connected to the LED driving current setting unit 420.

Figure 6:
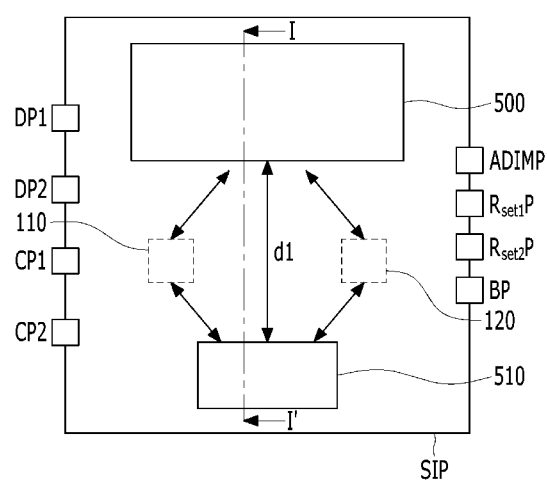
FIG. 6 is a schematic plan view showing a pin arrangement and a layout relationship of internal circuit elements of a system-in-package according to an exemplary embodiment.

FIG. 6 is a schematic plan view showing a pin arrangement and a layout relationship of internal circuit elements of a system-in-package according to an exemplary embodiment. FIG. 7 is a cross-sectional view along line I-I' of FIG. 6.

The SIP may include the driving module 500, functional modules such as the surge protector 110 and the dimming level detector 120, and a resistive element 510 as shown in FIG. 5. The driving module 500, the functional modules 110 and 120, and the resistive element 510 are mounted on a single substrate, on which the circuit elements are mounted is packaged. At this time, the functional module may further include a circuit element performing various functions in addition to the surge protector 110 and the dimming level detector 120.

In FIG. 6, only the driving module 500 and the resistive element 510, which are the circuit elements that may be generating the greatest amount of heat during driving, are shown in dark lines among the circuit elements of the SIP. The functional module 110 and 120 are shown in dots. However, it should be noted that other functional modules may also be mounted within a single SIP substrate.

The driving module 500 may be implemented as an integrated circuit (IC) including a driving current controller 300, a driving controller 400, an internal power supply unit 410, an LED driving current setting unit 420, and a dimming control unit 430. The driving module 500 controls the driving of the LED element groups.

The resistive element 510 is formed to prevent a large amount of power from being consumed in the driving module 500 due to a high level of holding current. For example, the resistive element 510 may include a bleeder resistor $R_{BLD}$ having a high resistance value.

Therefore, when the LED element groups are driven, the driving module 500 and the resistive element 510 may generate a large amount of heat. The SIP according to an exemplary embodiment separates two circuit elements generating the greatest amount of heat among the circuit elements from each other within the single substrate of the SIP, to effectively reduce heat generation in the SIP.

For example, as shown in FIG. 6, when the driving module 500 is mounted on the upper end of a single substrate, the resistive element 510 may be mounted on the opposing lower end of the single substrate. More particularly, the driving module 500 and the resistive element 510 may be spaced apart by a distance d1 to have the longest distance therebetween in a single substrate. For example, the distance d1 between the driving module 500 and the resistive element 510 may be greater than a distance between the driving module 500 and the functional modules 110 and 120, or a distance between the resistive element and the functional modules 110 and 120. In FIG. 6, the driving module 500 and the resistive element 510 are disposed on the upper and lower sides of a single substrate, respectively, but the inventive concepts are not limited thereto. For example, the driving module 500 and the resistive element 510 may each be disposed on opposing corners of the single substrate to have the longest distance therebetween within the single substrate.

Figure 7:
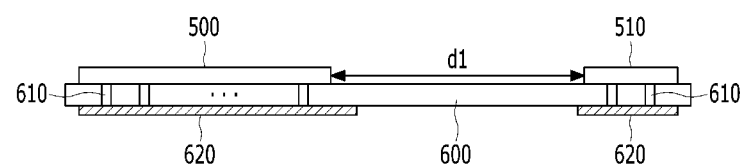
FIG. 7 is a cross-sectional view along line I-I' of FIG. 6.

Referring to FIG. 7, the driving module 500 and the resistive element 510 according to an exemplary embodiment may be connected to a heat dissipating unit 620 (e.g., a heat sink).

The heat dissipating unit 620 may be formed on a second surface opposite to the first surface of the single substrate 600, on which the circuit elements are formed. The heat dissipating unit 620 discharges the heat generated in the circuit elements to the outside.

The heat dissipating unit 620 may be formed as separate patterns on the second surface of the single substrate 600 to correspond to the driving module 500 and the resistive element 510, respectively. The heat dissipating unit 620 may be formed of a metal that facilitates heat dissipation, such as copper or the like.

A plurality of via holes 610 may be formed in the single substrate 600 to connect the driving module 500 and the resistive element 510 to the respective heat dissipating units 620. More particularly, the driving module 500 and the corresponding heat dissipating unit 620 are connected by the via holes 610 formed therebetween, so that heat generated in the driving module 500 can pass through the via hole 610, thereby discharging the heat through the heat dissipating unit 620.

Similarly, the resistive element 510 and the corresponding heat dissipating unit 620 are connected by the via holes 610 formed therebetween, so that heat generated in the resistance element 510 can pass through the via hole 610, thereby discharging the heat through the heat dissipating unit 620.

The SIP has a plurality of pins for connection with external components (e.g., rectifier 100 and light emitting element groups LED1 and LED2) and communication of signals. FIG. 6 shows some of the pins included in the SIP, however, various pins may be added in addition to the pins shown in FIG. 6.

The pins may include first signal pins for inputting and outputting a first signal (e.g., a large signal) for controlling the operation of the light emitting element groups LED1 and LED2, and second signal pins for inputting and outputting a second signal (e.g., a small signal) for controlling the driving of the driving controller 400.

For example, the first signal pins may include a first connection pin DP1 connected to the cathode terminal (fourth node N4) of the second LED group LED2, a second connection pin DP2 connected to the cathode terminal (second node N2) of the first LED group LED1, a third connection pin CP1 connected to the first electrode (third node N3) of the capacitor C1, and a fourth connection pin CP2 connected to the second electrode (third node N5) of the capacitor C1.

The second signal pins may include a bleeder input pin BP for inputting a holding current, dimming level signal input pin ADIMP for inputting dimming level signal Adim, and resistor connection pins Rset1P and Rset2P connected to resistors Rset1 and Rset2, respectively.

The first signal pins and the second signal pins may be spaced apart from each other in order to minimize the interference between input and output signals.

For example, when the first signal pins (e.g., DP1, DP2, CP1, and CP2) are disposed at the left end of a single substrate as shown in FIG. 6, the second signal pins (e.g., ADIMP, Rset1P, Rset2P, and BP) may be disposed at the right end in the single substrate opposing the left end. Although the pins shown in FIG. 6 are arranged on the left and right sides of a single substrate, the inventive concepts are not limited thereto.

Figure 8:
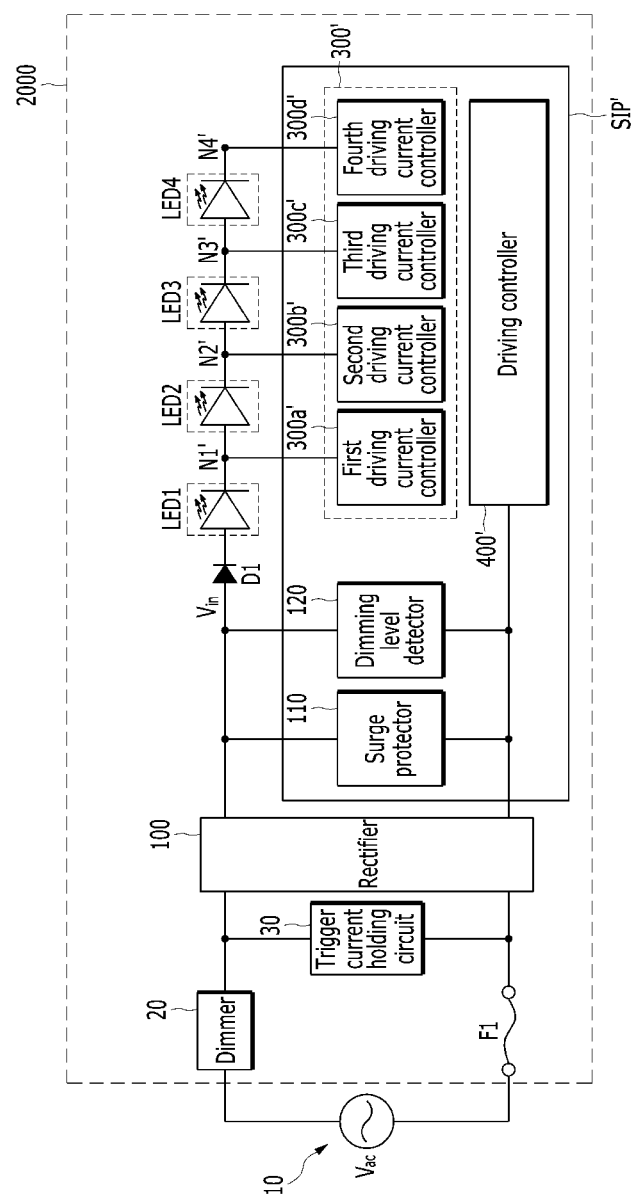
FIG. 8 is a block diagram of a LED lighting device according to another exemplary embodiment.

FIG. 8 is a block diagram of a LED lighting device according to another exemplary embodiment.

The LED lighting device 2000 according to an exemplary embodiment shown in FIG. 8 is substantially the same as the LED lighting device 1000 of FIG. 1, except for the number and the connection relation of the LED element groups and the configuration of the driving current controller 300' for controlling the operation of the LED element groups. As such, the same components of FIG. 1 are denoted by the same reference numerals in FIG. 8, and thus, repeated description thereof will be omitted.

Referring to FIG. 8, the LED element groups according to the exemplary embodiment may include a plurality of LED element groups LED1, LED2, LED3, and LED4. The lighting sequence of the LED element groups LED1, LED2, LED3, and LED4 is controlled by the driving controller 400'. Although FIG. 8 shows four LED element groups LED1, LED2, LED3, LED4, the inventive concepts are not limited thereto, and the number of LED element groups may be varied as needed.

The first LED element group LED1, the second LED element group LED2, the third LED element group LED3, and the fourth LED element group LED4 may have the same forward voltage level or different forward voltage levels from each other. For example, when the first LED element group LED1 to the fourth LED element group LED4 include different numbers of LED elements, the first LED element group LED1 to the fourth LED element group LED4 may have different forward voltage levels. When the first LED element group LED1 to the fourth LED element group LED4 include the same numbers of LED elements, the first LED element group LED1 to the fourth LED element group LED4 may have the same forward voltage levels.

The driving controller 400' may determine the voltage level of the driving voltage Vin from the rectifier 100, and sequentially drive the LED element groups LED1, LED2, LED3, and LED4 according to the voltage level of the driving voltage Vin.

For example, in the first-stage operation period, in which the voltage level of the driving voltage Vin is between the first forward voltage level Vf1 and the second forward voltage level Vf2, the driving controller 400' turns on the first driving current controller 300a' so that the first current path is connected and the remaining current paths are opened, thereby only the first LED element group LED1 emits light. In the second-stage operation period, in which the voltage level of the driving voltage Vin is between the second forward voltage level Vf2 and the third forward voltage level Vf3, the driving controller 400' turns on the second driving current controller 300b' so that the second current path is connected and the remaining current paths are opened, thereby only the first LED element group LED1 and the second LED element group LED2 emit light. In the third-stage operation period, in which the voltage level of the driving voltage Vin is between the third forward voltage level Vf3 and the fourth forward voltage level Vf4, the driving controller 400' turns on the third driving current controller 300c' so that the third current path is connected and the remaining current paths are opened, the first to third LED element groups LED1, LED2, and LED3 emit light. In the fourth-stage operation period, in which the voltage level of the driving voltage Vin is over the fourth forward voltage level Vf4, the driving controller 400' turns on the fourth driving current controller 300d' so that the fourth current path is connected and the remaining current paths are opened, thereby the first to fourth LED element groups LED1, LED2, LED3, and LED4 emit light. Accordingly, the driving controller 400' may sequentially drive the LED element groups LED1, LED2, LED3, and LED4 according to the voltage level of the driving voltage Vin as illustrated the above.

Figure 9:
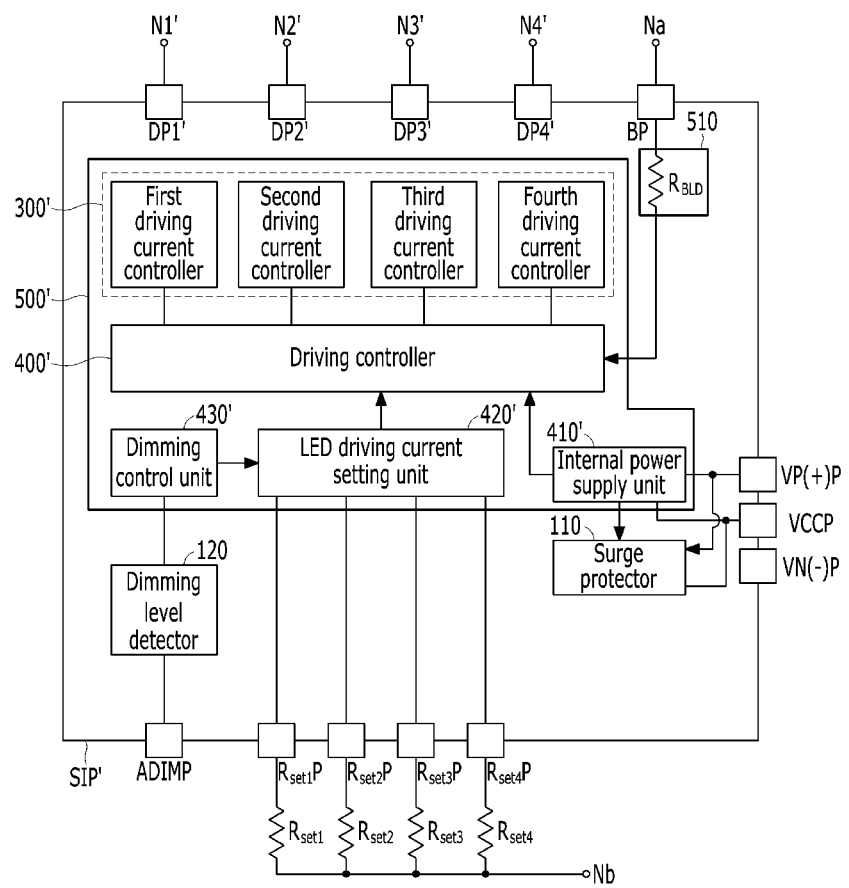
FIG. 9 is a block diagram schematically showing a configuration of a system-in-package according to another exemplary embodiment.
Figure 10:
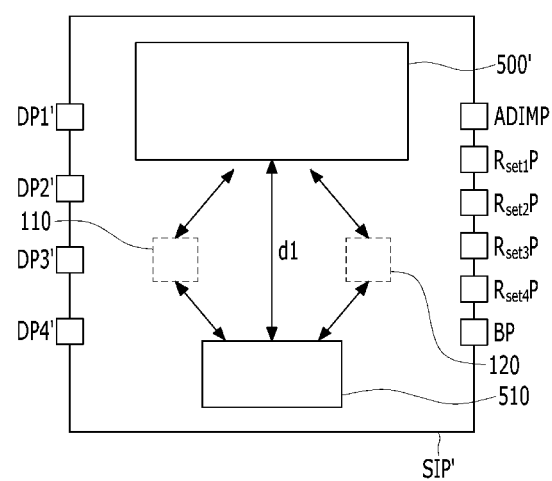
FIG. 10 is a schematic plan view showing a pin arrangement and a layout relationship of internal circuit elements of a system-in-package according to another exemplary embodiment.

FIG. 9 is a block diagram schematically showing a configuration of a system-in-package according to another exemplary embodiment. FIG. 10 is a schematic plan view showing a pin arrangement and a layout relationship of internal circuit elements of a system-in-package according to another exemplary embodiment.

The exemplary embodiment shown in FIG. 9 and FIG. 10 is substantially the same as that in FIGS. 5 and 6, except for the number and the connection relation of the LED element groups, the configuration of the driving current controller 300' for controlling the operation of the group, the LED driving current setting resistors Rset1, Rset2, Rset3, and Rset4, and the number of the resistor connection pins Rset1P, Rset2P, Rset3P, and Rset4P to be connected the LED driving current setting resistors. As such, the same components of FIGS. 5 and 6 are denoted by the same reference numerals in FIGS. 9 and 10, and thus, repeated description thereof will be omitted.

The system-in-package (SIP') according to an exemplary embodiment may include a driving current controller 300' including the first driving current controller 300a', the second driving current controller 300b', the third driving current controller 300c', and the fourth driving current controller 300d', a driving controller 400' for controlling the operation of the driving current controller 300', a surge protector 110, and a dimming level detector 120 to drive and control the LED element groups LED1, LED2, LED3, and LED4.

Referring to FIG. 9, the SIP' may include a driving module 500', which may be implemented as one IC chip, other functional modules 110 and 120, and a resistive element 510.

The driving module 500' may include an internal power supply unit 410', an LED driving current setting unit 420' and a dimming control unit 430', in addition to the driving current controller 300' and the driving controller 400'.

The LED driving current setting unit 420' sets the LED driving current value for each operation period based on the resistance values of the external LED driving current setting resistors Rset1, Rset2, Rset3, and Rset4.

The SIP' according to an exemplary embodiment includes a plurality of pins. The pins include first signal pins for inputting and outputting a first signal (e.g., a large signal) to control the operation of the LED element groups LED1, LED2, LED3, and LED4, and second signal pins for inputting and outputting a second signal (e.g., a small signal) to control the driving of the driving controller 400'.

For example, the first signal pins may include a first connection pin DP1' connected to the cathode terminal (first node N1') of the first LED group LED1, a second connection pin DP2' connected to the cathode terminal (second node N2') of the second LED group LED2, a third connection pin DP3' connected to the cathode terminal (third node N3') of the third LED group LED3, and a fourth connection pin DP4' connected to the cathode terminal (fourth node N4') of the fourth LED group LED4.

Referring to FIG. 9, DP1' is connected to the first driving current controller 300a', DP2' is connected to the second driving current controller 300b', DP3' is connected to the third driving current controller 300c', and DP4' is connected to the fourth driving current controller 300d'. Through this connection, the SIP' can be connected to the LED element groups (LED1, LED2, LED3, and LED4) as shown in FIG. 8.

The second signal pins may include a bleeder input pin BP for inputting a holding current, driving voltage input pins VP (+) P and VN (−) P for inputting a driving voltage VP, dimming level signal input pin ADIMP for inputting dimming level signal Adim, resistor connection pins Rset1P and Rset2P connected to resistors Rset1 and Rset2, respectively, and an internal power pin VCCP connected to the ground. The resistor connection pins Rset1P and Rset2P are connected to the LED driving current setting unit 420'.

The SIP' according to the exemplary embodiment separates two circuit elements generating the greatest amount of heat among the plurality of circuit elements packaged in the single substrate apart from each other in the SIP', to effectively reduce heat.

For example, as shown in FIG. 10, when the driving module 500' is mounted on the upper end of a single substrate, the resistive element 510 can be mounted on the opposing lower end of the single substrate. In particular, the driving module 500' and the resistive element 510 may be spaced apart by the distance d1 to have the longest distance therebetween in a single substrate. For example, the distance d1 between the driving module 500' and the resistive element 510 may be greater than a distance between the driving module 500' and the functional modules 110 and 120, or a distance between the resistive element 51' and the functional modules 110 and 120. In FIG. 10, the driving module 500' and the resistive element 510 are disposed on the upper and lower sides of a single substrate, respectively, but the inventive concepts are not limited thereto. For example, the driving module 500' and the resistive element 510 may each be disposed on opposing corners of the single substrate to have the longest distance therebetween within the single substrate.

Also, the first signal pins and the second signal pins may be arranged separately from each other in order to minimize the interference between input and output signals.

For example, when the first signal pins (e.g., DP1', DP2', DP3', and DP4') are disposed at the left end of a single substrate as shown in FIG. 10, the second signal pins (e.g., ADIMP, Rset1P, Rset2P, Rset3P, Rset4P, and BP) may be placed at the opposing right end in the single substrate. Although the pins in FIG. 10 are shown to be arranged on the left and right sides of a single substrate, the inventive concepts are not limited thereto.

According to the exemplary embodiments, dimmable LED lighting devices may have a reduce size by including a system-in-package, in which the circuit elements driving the LED elements integrated into the package, thereby reducing the manufacturing costs of the devices.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements.

What is claimed is:

1. A light-emitting diode (LED) lighting apparatus comprising:
    at least one LED group comprising a plurality of LEDs;
    a rectifier configured to rectify an alternating current (AC) voltage and generate a driving voltage for the at least one LED group; and
    a system-in-package (SIP) configured to drive and control the at least one LED group, the SIP connected to the at least one LED group and the rectifier,
    wherein:
    the SIP comprises a driving module, a functional module, and a first resistor disposed on a single substrate; and
    the driving module comprises:
        a driving controller configured to determine a magnitude of the driving voltage and control driving of the at least one LED group according to the magnitude of the driving voltage;
        a driving current controller configured to control a current flowing in each LED group to have a constant value;
        an internal power supply unit configured to generate an internal power used in the driving module from the driving voltage;
        an LED driving current setting Unit configured to set an LED driving current value for each operation period based on resistance values of external LED driving current setting resistors; and
        a dimming control unit configured to provide a dimming signal to at least one of the driving controller and the LED driving current setting unit.

2. The lighting apparatus of claim 1, wherein the functional module comprises a dimming level detector configured to receive the driving voltage and detect currently selected dimming level based on the driving voltage.

3. The lighting apparatus of claim 2, wherein the functional module further comprises a surge protector configured to protect the at least one LED group from an over voltage or an over current.

4. The lighting apparatus of claim 1, wherein the first resistor is a bleeder resistor having a high resistance value.

5. The lighting apparatus of claim 1, wherein:
    the driving module and the first resistor generate the greatest amount of heat in the SIP; and
    a distance between the driving module and the first resistor within the single substrate is greater than a distance between the driving module and the functional module and a distance between the first resistor and the functional module.

6. The lighting apparatus of claim 5, wherein the driving module and the first resistor are disposed adjacent to opposing corners of the single substrate, respectively.

7. The lighting apparatus of claim 1, wherein the SIP further comprises a heat dissipating unit disposed on a bottom surface opposing an upper surface of the single substrate on which the driving module, the functional module, and the first resistor are disposed.

8. The lighting apparatus of claim 7, wherein the driving module and the first resistor are connected to the heat dissipating unit.

9. The lighting apparatus of claim 8, wherein the heat dissipating unit comprises a plurality of patterns spaced apart from each other, the plurality of patterns disposed on the bottom surface of the single substrate to correspond to the driving module and the first resistor, respectively.

10. The lighting apparatus of claim 9, wherein the single substrate has a plurality of via holes to connect the driving module and the first resistor to the plurality of patterns of the heat dissipating unit.

11. The lighting apparatus of claim 1, wherein the SIP further comprises:
    first signal pins configured to input and output a first signal for controlling an operation of the at least one LED group; and
    second signal pins configured to input and output a second signal for controlling the driving controller.

12. The lighting apparatus of claim 11, wherein the first signal pins are disposed along a first end of the single substrate and the second signal pins are disposed along a second end opposing the first end of the single substrate.

13. A system-in-package (SIP) for LED lighting apparatus having at least one LED group and a rectifier configured to rectify an alternating current (AC) voltage and generate a driving voltage, the SIP comprising:
    a driving module comprising:
        a driving controller configured to determine a magnitude of the driving voltage and control driving of the at least one LED group according to the magnitude of the driving voltage;
        a driving current controller configured to control a current flowing in each LED group to have a constant value;
        an internal power supply unit configured to generate an internal power used in the driving module from the driving voltage;
        an LED driving current setting unit configured to set an LED driving current value for each operation period based on resistance values of external LED driving current setting resistors; and
        a dimming control unit configured to provide a dimming signal to at least one of the driving controller and the LED driving current setting unit;
    a functional module comprising a dimming level detector configured to receive the driving voltage and detect currently selected dimming level based on the driving voltage; and
    a first resistor having a high resistance value to prevent high power from being consumed by the driving module,
    wherein the driving module, the function module, and the first resistor are disposed on a single substrate.

14. The SIP of claim 13, wherein:
    the driving module and the first resistor generate the greatest amount of heat in the SIP; and
    a distance between the driving module and the first resistor within the single substrate is greater than a distance between the driving module and the functional module and a distance between the first resistor and the functional module.

15. The SIP claim 13, further comprising a heat dissipating unit disposed on a lower surface opposing an upper surface of the single substrate on which the driving module, the functional module, and the first resistor are formed, wherein the heat dissipating unit comprises a plurality of patterns disposed on the lower surface of the single substrate to correspond to the driving module and the first resistor, respectively.

16. The SIP of claim 15, wherein the single substrate has a plurality of via holes to connect the driving module and the first resistor to the plurality of patterns of the heat dissipating unit.

17. The SIP of claim 13, further comprising:
first signal pins configured to input and output a first signal for controlling an operation of the at least one LED group; and
second signal pins configured to input and output a second signal for controlling the driving controller.

18. The SIP of claim 17, wherein the first signal pins are disposed along a first end of the single substrate and the second signal pins are disposed along a second end opposing the first end of the single substrate.

* * * * *